(12) United States Patent
Hashimoto

(10) Patent No.: US 6,965,164 B2
(45) Date of Patent: Nov. 15, 2005

(54) ELECTRONIC DEVICE AND METHOD OF MANUFACTURING THE SAME

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/829,146

(22) Filed: Apr. 21, 2004

(65) Prior Publication Data

US 2004/0262758 A1    Dec. 30, 2004

(30) Foreign Application Priority Data

Apr. 22, 2003    (JP) .............................. 2003-116896

(51) Int. Cl.[7] .............................................. H01L 23/48
(52) U.S. Cl. ...................... 257/737; 257/734; 438/613; 438/612
(58) Field of Search ............................... 257/734, 737, 257/773; 438/612, 613

(56) References Cited

U.S. PATENT DOCUMENTS

| 6,255,737 | B1 | 7/2001 | Hashimoto |
| 6,313,532 | B1 * | 11/2001 | Shimoishizaka et al. .... 257/734 |
| 6,323,542 | B1 | 11/2001 | Hashimoto |
| 6,475,896 | B1 | 11/2002 | Hashimoto |

FOREIGN PATENT DOCUMENTS

| JP | 09-033940 | 2/1997 |
| JP | 2798027 | 7/1998 |
| JP | 11-220069 | 8/1999 |
| JP | 11-340369 | 12/1999 |
| JP | 2000-150716 | 5/2000 |
| JP | 2002-170839 | 6/2002 |

OTHER PUBLICATIONS

U.S. Appl. No. 10/828,101, filed Apr. 19, 2004, Hashimoto.

* cited by examiner

*Primary Examiner*—Douglas W. Owens
(74) *Attorney, Agent, or Firm*—Hogan & Hartson, LLP

(57) ABSTRACT

An electronic device includes a semiconductor substrate in which an integrated circuit is formed; an insulating layer which is formed on the semiconductor substrate and includes an elastically deformable section; an electrode which is electrically connected with inside of the semiconductor substrate and is formed on the elastically deformable section; and a substrate on which an interconnect pattern is formed, the interconnect pattern facing the electrode and being electrically connected with the electrode. The elastically deformable section is elastically deformed in a manner to be depressed under the electrode, and presses the electrode against the interconnect pattern due to elasticity.

5 Claims, 7 Drawing Sheets

ELECTRONIC DEVICE AND METHOD OF MANUFACTURING THE SAME

Japanese Patent Application No. 2003-116896, filed on Apr. 22, 2003, is hereby incorporated by reference in its entirety.

BACKGROUND OF THE INVENTION

The present invention relates to an electronic device and a method of manufacturing the same, and an electronic instrument.

It is known in the art that a semiconductor chip is bonded face down to a hard substrate, such as in chip-on-glass (COG). In this mounting form, since the substrate has no, or only a small degree of, elasticity, an increase in bonding strength of the electrical connection section between the semiconductor chip and the substrate has been demanded.

BRIEF SUMMARY OF THE INVENTION

An electronic device according to one aspect of the present invention includes:

a semiconductor substrate in which an integrated circuit is formed;

an insulating layer which is formed on the semiconductor substrate and includes an elastically deformable section;

an electrode which is electrically connected with inside of the semiconductor substrate and is formed on the elastically deformable section; and a substrate on which an interconnect pattern is formed, the interconnect pattern facing the electrode and being electrically connected with the electrode, wherein the elastically deformable section is elastically deformed in a manner to be depressed under the electrode, and presses the electrode against the interconnect pattern due to elasticity.

An electronic instrument according to another aspect of the present invention has the above electronic device.

A method of manufacturing an electronic device according to a further aspect of the present invention includes:

mounting a semiconductor device on a substrate on which an interconnect pattern is formed, wherein the semiconductor device includes a semiconductor substrate in which an integrated circuit is formed, an insulating layer which is formed on the semiconductor substrate and includes an elastically deformable section, and an electrode which is electrically connected with inside of the semiconductor substrate and is formed on the elastically deformable section, and wherein, in the mounting step, the semiconductor device and the substrate are disposed so that the electrode faces the interconnect pattern, and the elastically deformable section is elastically deformed in a manner to be depressed under the electrode.

DETAILED DESCRIPTION OF THE EMBODIMENT

Figure 1:
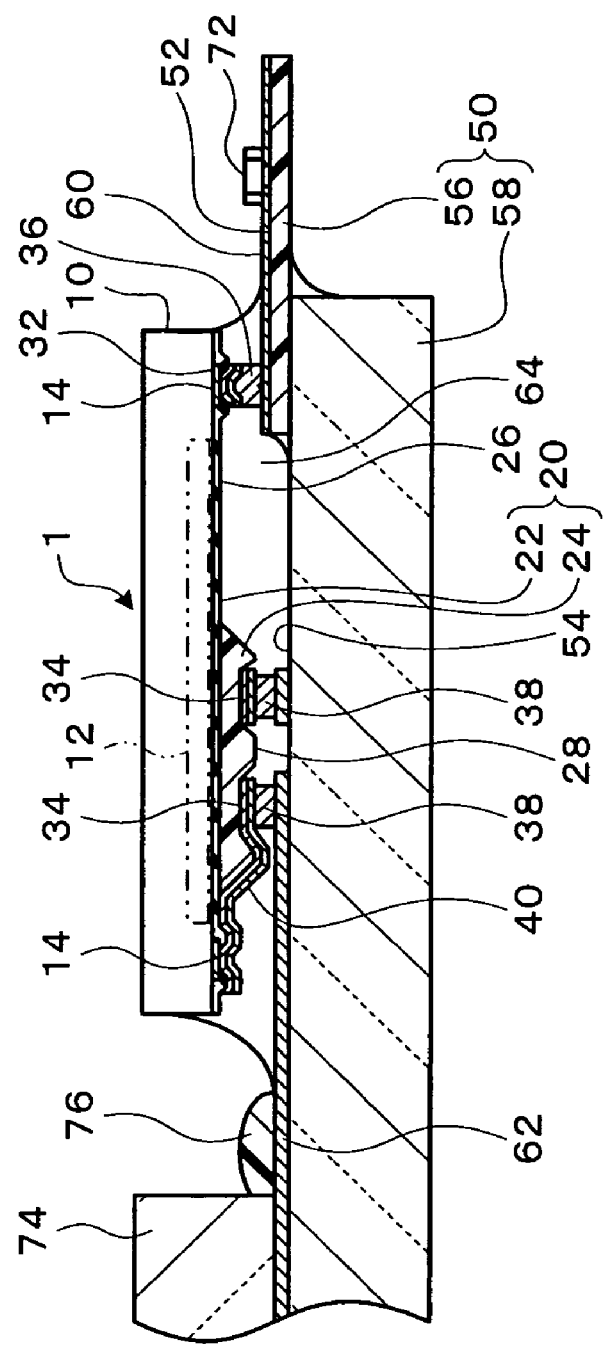
FIG. 1 is illustrative of an electronic device according to an embodiment of the present invention.

An embodiment of the present invention may increase the bonding strength of the electrical connection section between the semiconductor substrate and the substrate.

(1) An electronic device according to one embodiment of the present invention includes:

a semiconductor substrate in which an integrated circuit is formed;

an insulating layer which is formed on the semiconductor substrate and includes an elastically deformable section;

an electrode which is electrically connected with inside of the semiconductor substrate and is formed on the elastically deformable section; and a substrate on which an interconnect pattern is formed, the interconnect pattern facing the electrode and being electrically connected with the electrode, wherein the elastically deformable section is elastically deformed in a manner to be depressed under the electrode, and presses the electrode against the interconnect pattern due to elasticity.

According to this electronic device, since the insulating layer presses the electrode against the interconnect pattern due to its elasticity, the bonding strength of the electrical connection section between the semiconductor substrate and the substrate can be increased.

(2) This electronic device may further include a bump formed between the electrode and the interconnect pattern, and the electrode may be electrically connected with the interconnect pattern through the bump.

(3) With this electronic device, the bump may include a nickel layer.

(4) An electronic instrument according to another embodiment of the present invention includes the above electronic device.

(5) A method of manufacturing an electronic device according to a further embodiment of the present invention includes:

mounting a semiconductor device on a substrate on which an interconnect pattern is formed, wherein the semiconductor device includes a semiconductor substrate in which an integrated circuit is formed, an insulating layer which is formed on the semiconductor substrate and includes an elastically deformable section, and an electrode which is electrically connected with inside of the semiconductor substrate and is formed on the elastically deformable section, and wherein, in the mounting step, the semiconductor device and the substrate are disposed so that the electrode faces the interconnect pattern, and the elastically deformable section is elastically deformed in a manner to be depressed under the electrode.

According to this method of manufacturing an electronic device, since the insulating layer is elastically deformed, the electrode can be pressed against the interconnect pattern due to elasticity of the insulating layer, whereby the bonding strength of the electrical connection section between the semiconductor substrate and the substrate can be increased.

With this method of manufacturing an electronic device, the semiconductor device may further include a bump formed on the electrode, and the elastically deformable section may be elastically deformed through the bump.

Figure 2:
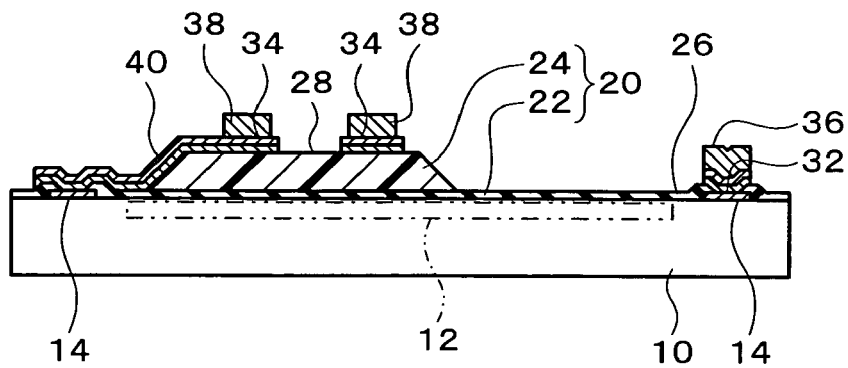
FIG. 2 is a cross-sectional view along the line II—II shown in FIG. 3.
Figure 3:
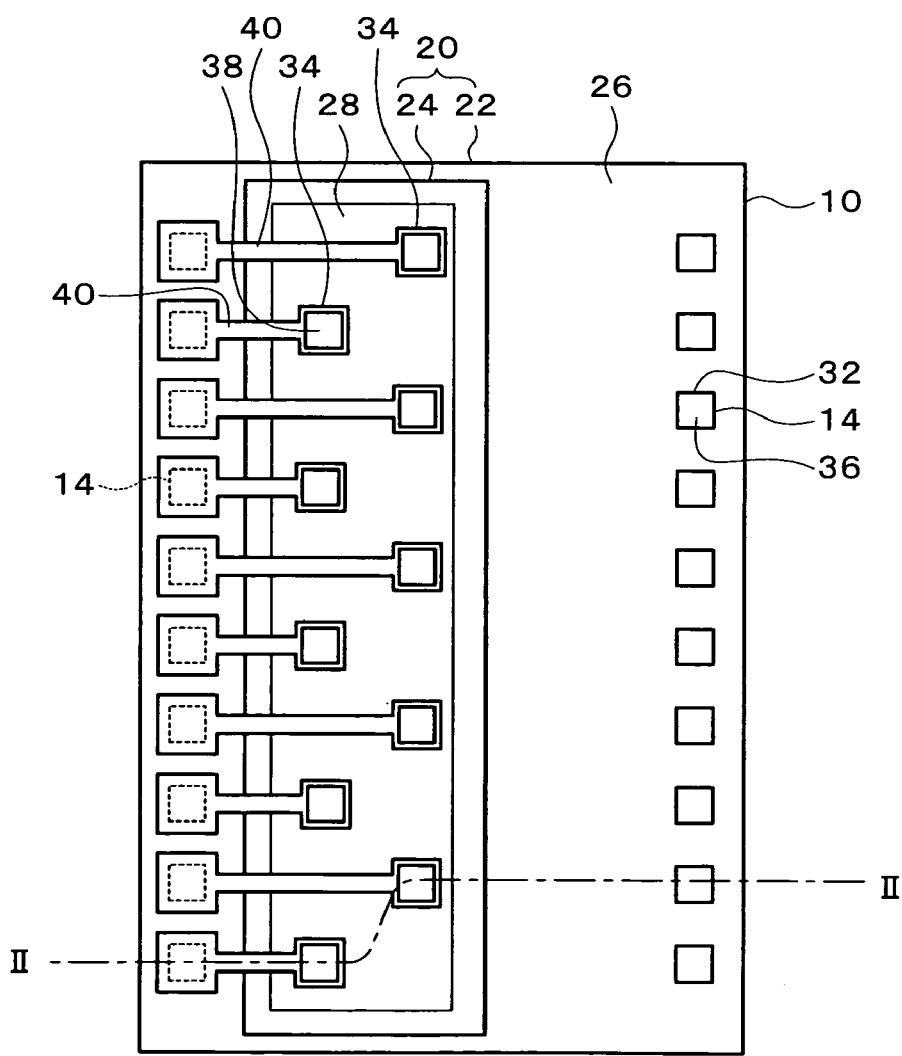
FIG. 3 is illustrative of a semiconductor device.

FIG. 1 is illustrative of an electronic device according to an embodiment of the present invention. The electronic device includes a semiconductor device 1. FIGS. 2 and 3 are illustrative of the semiconductor device. FIG. 2 is a cross-sectional view along the line II—II shown in FIG. 3.

The semiconductor device 1 includes a semiconductor substrate 10 (semiconductor chip, for example). An integrated circuit 12 is formed in the semiconductor substrate 10. A plurality of pads 14 are formed on the semiconductor substrate 10. The pad 14 is electrically connected with the inside of the semiconductor substrate 10. The pad 14 may be a part (end) of an interconnect electrically connected with the integrated circuit 12. The pads 14 may be formed in the peripheral section (edges) of the surface of the semiconductor substrate 10. The pads 14 may be formed along four sides or two sides of the surface of the semiconductor substrate 10, for example. The pad 14 is formed of Al, for example. Although not illustrated in the drawings, the pad 14 may be formed so as to overlap the integrated circuit 12.

An insulating layer 20 (electrical insulating layer in more detail) is formed on the semiconductor substrate 10. The insulating layer 20 may include a passivation film 22. The passivation film 22 may be formed only of a material other than a resin ($SiO_2$ or SiN, for example), or may include a resin layer. An opening which exposes at least a part (center, for example) of the pad 14 is formed in the passivation film 22. Specifically, the passivation film 22 is formed to avoid at least the center of the pad 14. The passivation film 22 may be placed on the edges of the pad 14.

The insulating layer 20 includes an elastically deformable section 24. The elastically deformable section 24 has elastic deformation properties (or a stress relaxation function). The elastically deformable section 24 is formed on the passivation film 22. The elastically deformable section 24 is preferably formed of an elastic resin such as a polyimide resin, silicone-modified polyimide resin, epoxy resin, silicone-modified epoxy resin, benzocyclobutene (BCB), or polybenzoxazole (PBO). The elastically deformable section 24 may be formed of an inorganic material (such as glass) insofar as the material has elasticity. The elastically deformable section 24 may be formed on a part of the passivation film 22. The elastically deformable section 24 may be formed at a position closer to one of the edges of the semiconductor substrate 10, for example. At least a part (only a part, for example) of the elastically deformable section 24 may be formed in a region which overlaps the integrated circuit 12. The elastically deformable section 24 may have an inclined side surface.

The insulating layer 20 includes first and second surfaces 26 and 28. The second surface 28 is formed to be higher than the first surface 26 from the surface of the semiconductor substrate 10. The first surface 26 may be the surface (upper surface) of the passivation film 22. The second surface 28 may be the surface (upper surface) of the elastically deformable section 24.

The semiconductor device 1 includes first and second electrodes 32 and 34. The first and second electrodes 32 and 34 may not be electrically connected outside the semiconductor substrate 10. The first electrode 32 is formed to avoid the second surface 28. The first electrode 32 is the pad 14. The first electrode 32 is electrically connected with the inside of the semiconductor substrate 10 (integrated circuit 12, for example). A bump 36 may be formed on the first electrode 32. The first electrodes 32 may be rearranged (pitch-converted) on the passivation film 22. The first electrodes 32 may be arranged in a plurality of columns. In the case where the first electrodes 32 are arranged in a plurality of columns, the first electrodes 32 may be disposed in a staggered arrangement.

The second electrode 34 is formed on the elastically deformable section 24 (second surface 28). The second electrode 34 is formed at a position higher than the first electrode 32. The pitch can be increased by disposing the second electrodes 34 in a staggered arrangement (see FIG. 3). The second electrodes 34 may be disposed in a single column. A bump 38 may be formed on the second electrode 34. The bumps 36 and 38 may be formed of the same material. The bumps 36 and 38 include an Ni layer and may have a structure in which a layer formed of Au, Cr, or Al is stacked on the Ni layer.

The second electrode 34 is electrically connected with the inside of the semiconductor substrate 10 (integrated circuit 12, for example). The pad 14 may be electrically connected with the second electrode 34 through an interconnect 40. The interconnect 40 is formed from the pad 14 so as to extend to the second surface 28. The interconnect 40 may pass over the first surface 26.

The electronic device includes a support member 50. The support member 50 includes a first support surface 52 and a second support surface 54 lower than the first support surface 52. The support member 50 may include first and second substrates 56 and 58. The first and second substrates 56 and 58 are attached so as to include an overlapping region. The first and second substrates 56 and 58 may be attached by using an adhesive or the like. The first substrate 56 is a flexible substrate, for example. An electronic part 72 may be mounted on the first substrate 56. The second substrate 58 is at least a part of an electronic panel (liquid crystal panel, electroluminescent panel, or the like). In a liquid crystal panel, another substrate 74 is provided so as to face the second substrate 58. The second substrate 58 is disposed to project from the substrate 74. A resin 76 may be provided on the second support surface 54 of the second substrate 58 in the peripheral section of the substrate 74.

The surface of the first substrate 56 opposite to the second substrate 58 in the overlapping region with the second substrate 58 is the first support surface 52. The surface of the second substrate 58 on the side of the first substrate 56 outside the overlapping region with the first substrate 56 is the second support surface 54.

A first interconnect pattern 60 is formed on the first support surface 52, and a second interconnect pattern 62 is formed on the second support surface 54. The first electrode 32 of the semiconductor device 1 is electrically connected face-to-face with the first interconnect pattern 60. The second electrode 34 of the semiconductor device 1 is electrically connected face-to-face with the second interconnect pattern 62. The bump 36 is present between the first electrode 32 and the first interconnect pattern 60. The bump 38 is present between the second electrode 34 and the second interconnect pattern 62. Therefore, the first electrode 32 is electrically connected with the first interconnect pattern 60 through the bump 36, and the second electrode 34 is electrically connected with the second interconnect pattern 62 through the bump 38. An anisotropic conductive material 64 (anisotropic conductive film or anisotropic conductive paste) may be used to achieve electrical connection. An insulating adhesive or an insulating adhesive film may be used instead of the anisotropic conductive material.

As shown in FIG. 1, the semiconductor substrate 10 and the support member 50 (second substrate 58) are bonded so as to be pulled against each other by utilizing the shrinkage force of an adhesive (binder of the anisotropic conductive material 64, insulating adhesive, adhesive film, or the like), for example. This causes the elastically deformable section 24 to be elastically deformed so as to be depressed under the second electrode 34. The second electrode 34 (or bump 38) is pressed against the second interconnect pattern 62 due to the elastic force of the elastically deformable section 24. According to the present embodiment, since the insulating layer 20 (elastically deformable section 24 in more detail) presses the second electrode 34 (or bump 38) against the second interconnect pattern 62 due to its elasticity, the bonding strength of the electrical connection section between the semiconductor substrate 10 and the second substrate 58 can be increased.

According to the present embodiment, the semiconductor device 1 includes the first and second electrodes 32 and 34 formed on the surfaces at different heights, and is mounted in the region with a level difference (first and second support surfaces 52 and 54). In the present embodiment, since only a part of the semiconductor device 1 overlaps the first substrate 56, the size of the first substrate 56 can be reduced.

Figure 4A:
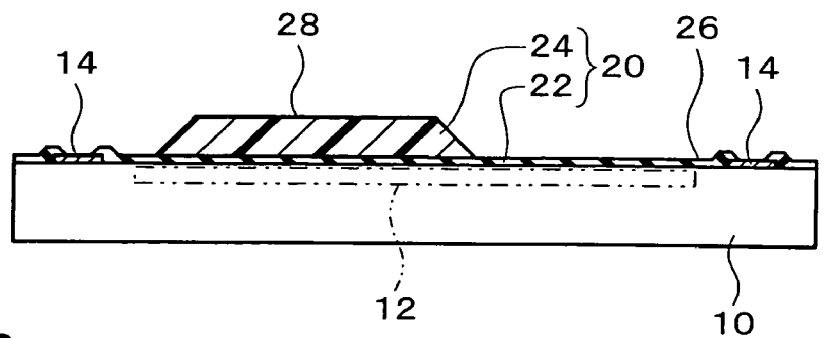
FIGS. 4A to 4D are illustrative of a method of manufacturing a semiconductor device.

FIGS. 4A to 5C are illustrative of a method of manufacturing the semiconductor device. As shown in FIG. 4A, the insulating layer 20 having the first surface 26 and the second surface 28 higher than the first surface 26 is formed on the semiconductor substrate 10. In the case where the semiconductor substrate 10 is a semiconductor wafer, the elastically deformable section 24 is formed in the region which becomes the semiconductor chip. The elastically deformable section 24 is formed in the region which overlaps the integrated circuit 12. The elastically deformable section 24 may be formed by patterning (etching, for example) an insulating layer (resin layer, for example) formed on the semiconductor substrate 10 (entire surface of the semiconductor substrate, for example).

Figure 4B:
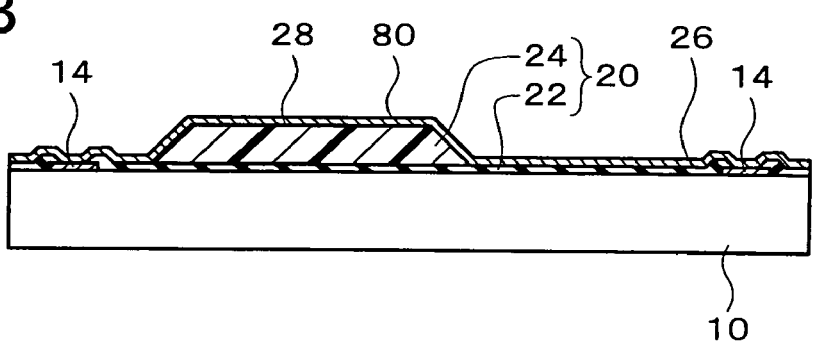

As shown in FIG. 4B, a single-layer or multilayer conductive film 80 is formed. The conductive film 80 may be formed by using a TiW film and a Cu film formed on the TiW film, for example. The conductive film 80 may be formed by sputtering. The conductive film 80 may be formed over the entire first and second surfaces 26 and 28.

Figure 4C:
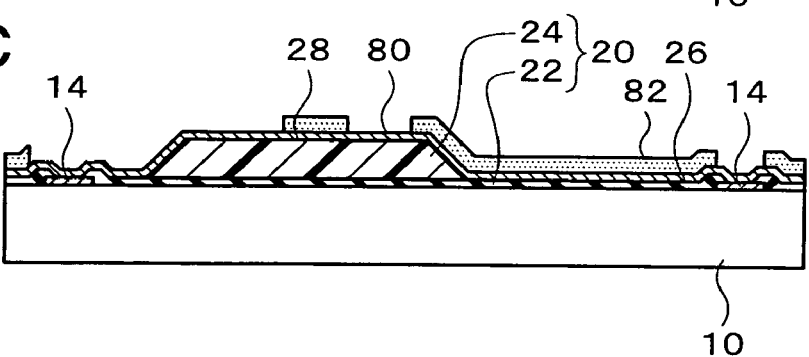

As shown in FIG. 4C, a first resist layer 82 (resin layer, for example) is formed on the conductive film 80 so as to exclude the regions of the first and second electrodes 32 and 34. In the case of forming the interconnect 40 (see FIG. 3), the first resist layer 82 is formed to exclude the region of the interconnect 40. A resist layer formed on the conductive film 80 (entire surface of the conductive film 80, for example) may be patterned by using a photolithographic step and the like.

Figure 4D:
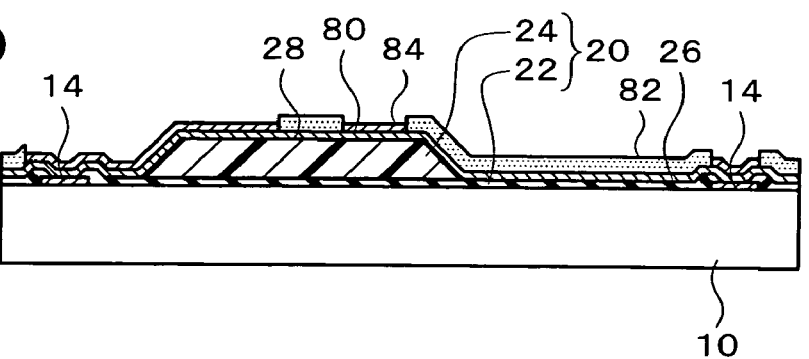

As shown in FIG. 4D, a first metal layer 84 (Cu layer, for example) is formed on the surface of the conductive film 80 exposed from the first resist layer 82 by electroplating using the conductive film 80 as an electrode. The first metal layer 84 may be formed by electroless plating. The first resist layer 82 is then removed.

Figure 5A:
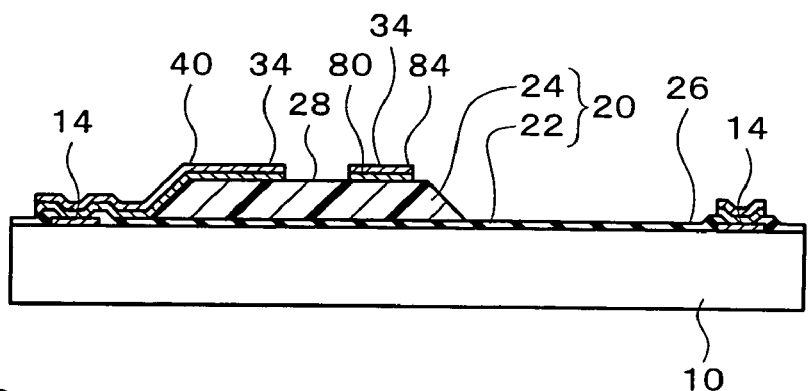
FIGS. 5A to 5C are illustrative of a method of manufacturing a semiconductor device.

As shown in FIG. 5A, the conductive film 80 is etched by using the first metal layer 84 as a mask. The second electrode 34 and the interconnect 40 can be formed by this step. The second electrode 34 is formed on the second surface 28. In the present embodiment, the pad 14 is the first electrode 32.

Figure 5B:
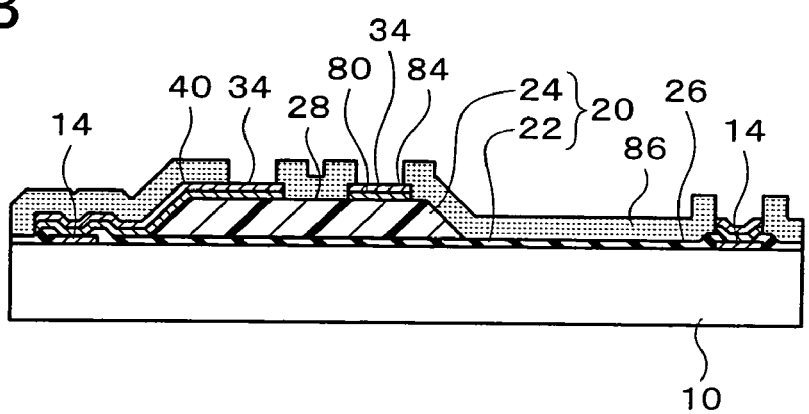

As shown in FIG. 5B, a second resist layer 86 (resin layer, for example) is formed so as to exclude the formation regions of the bumps 36 and 38 (at least the center of the first and second electrodes 32 and 34).

Figure 5C:
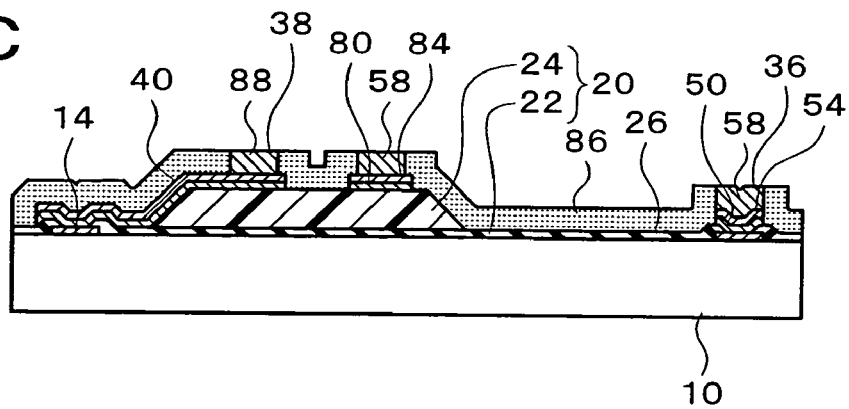

As shown in FIG. 5C, a single-layer or multilayer second metal layer 88 (Ni, Au, Cr, or Al, for example) is formed on the surface of the first metal layer 84 exposed from the second resist layer 86 (formation regions of the bumps 36 and 38). The bumps 36 and 38 are formed by this step.

In the case where the semiconductor substrate 10 is a semiconductor wafer, a method of manufacturing the semiconductor device may include a step of cutting (dicing) the semiconductor substrate 10. The rest of the details of the manufacturing method is derived from the configuration of the above-described semiconductor device. According to the present embodiment, since the first and second electrodes 32 and 34 are formed on the surfaces at different heights, the semiconductor device can be mounted in a region with a level difference.

Figure 6:
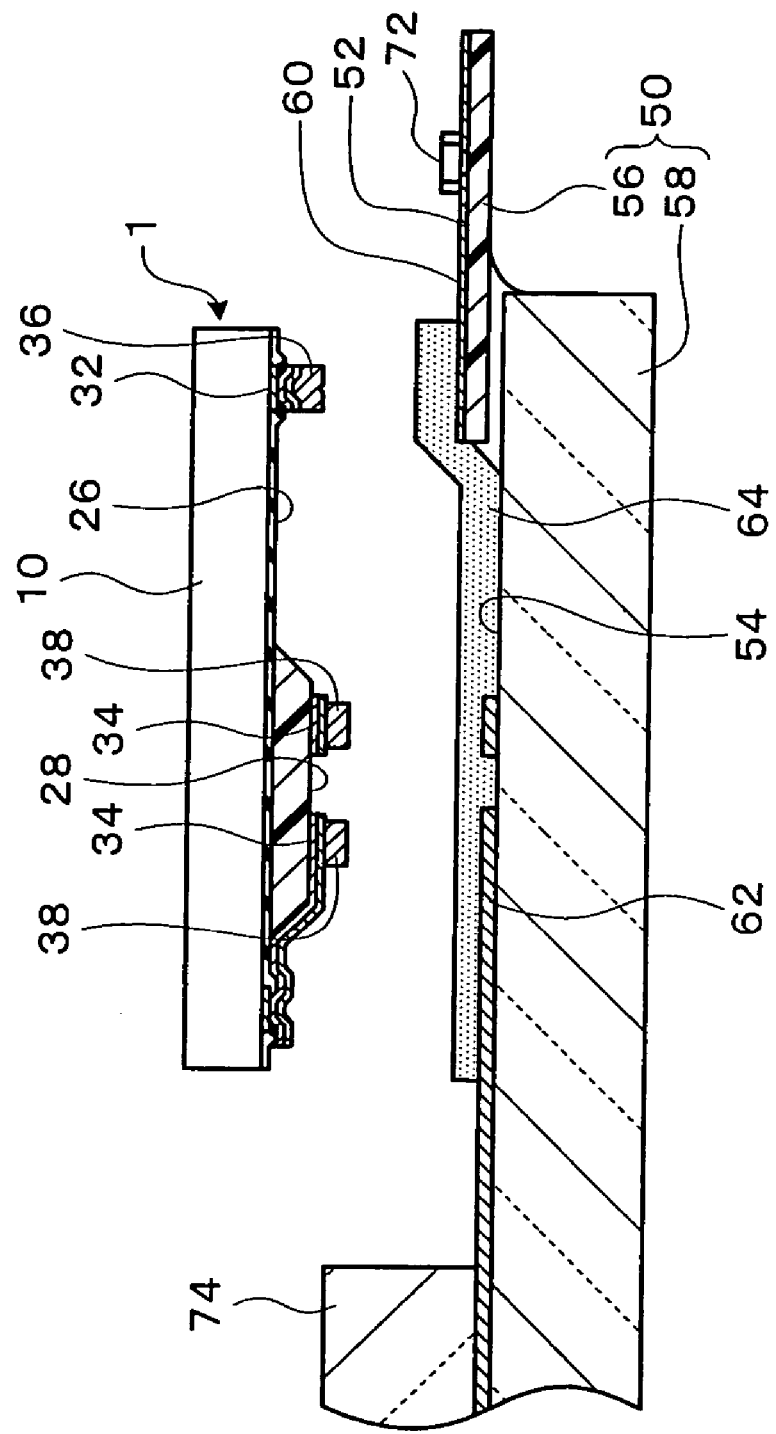
FIG. 6 is illustrative of a method of manufacturing an electronic device according to an embodiment of the present invention.

FIG. 6 is illustrative of a method of manufacturing an electronic device according to an embodiment of the present invention. This manufacturing method includes a step of mounting the semiconductor device 1 on the second substrate 58 on which the second interconnect pattern 62 is formed. Or, this manufacturing method includes a step of mounting the semiconductor device 1 on the support member 50 having the first support surface 52 and the second support surface 54 lower than the first support surface 52. The first and second substrates 56 and 58 are attached before mounting the semiconductor device 1. The first electrode 32 of the semiconductor device 1 is electrically connected face-to-face with the first interconnect pattern 60. The second electrode 34 of the semiconductor device 1 is electrically connected face-to-face with the second interconnect pattern 62. The anisotropic conductive material 64 (anisotropic conductive film or anisotropic conductive paste) may be used to electrically connect the electrode with the interconnect pattern. The electrical connection may be achieved by pressure welding using a resin such as an adhesive.

In the mounting step, the semiconductor device 1 and the second substrate 58 are disposed so that the second electrode 34 faces the second interconnect pattern 62. The elastically deformable section 24 is elastically deformed so as to be depressed under the second electrode 34. For example, pressure is applied between the semiconductor device 1 and the second substrate 58. The elastically deformable section 24 may be elastically deformed through the bump 38. Force which pulls the semiconductor device 1 and the second substrate 58 against each other is applied between the semiconductor device 1 and the second substrate 58 by utilizing the shrinkage force of an adhesive (binder of the anisotropic conductive material 64, for example) or the like. The pulling force is maintained after the adhesive is cured.

According to the present embodiment, the insulating layer 20 (elastically deformable section 24 in more detail) is elastically deformed and maintained in the elastically deformed state. Therefore, the second electrode 34 can be pressed against the second interconnect pattern 62 by utilizing elasticity, whereby the bonding strength of the electrical connection section between the semiconductor substrate 10 and the second substrate 58 can be increased. According to the present embodiment, since the first and second electrodes 32 and 34 of the semiconductor device 1 are formed on the surfaces at different heights, the semiconductor device 1 can be mounted in a region with a level difference (first and second support surfaces 52 and 54).

Figure 7:
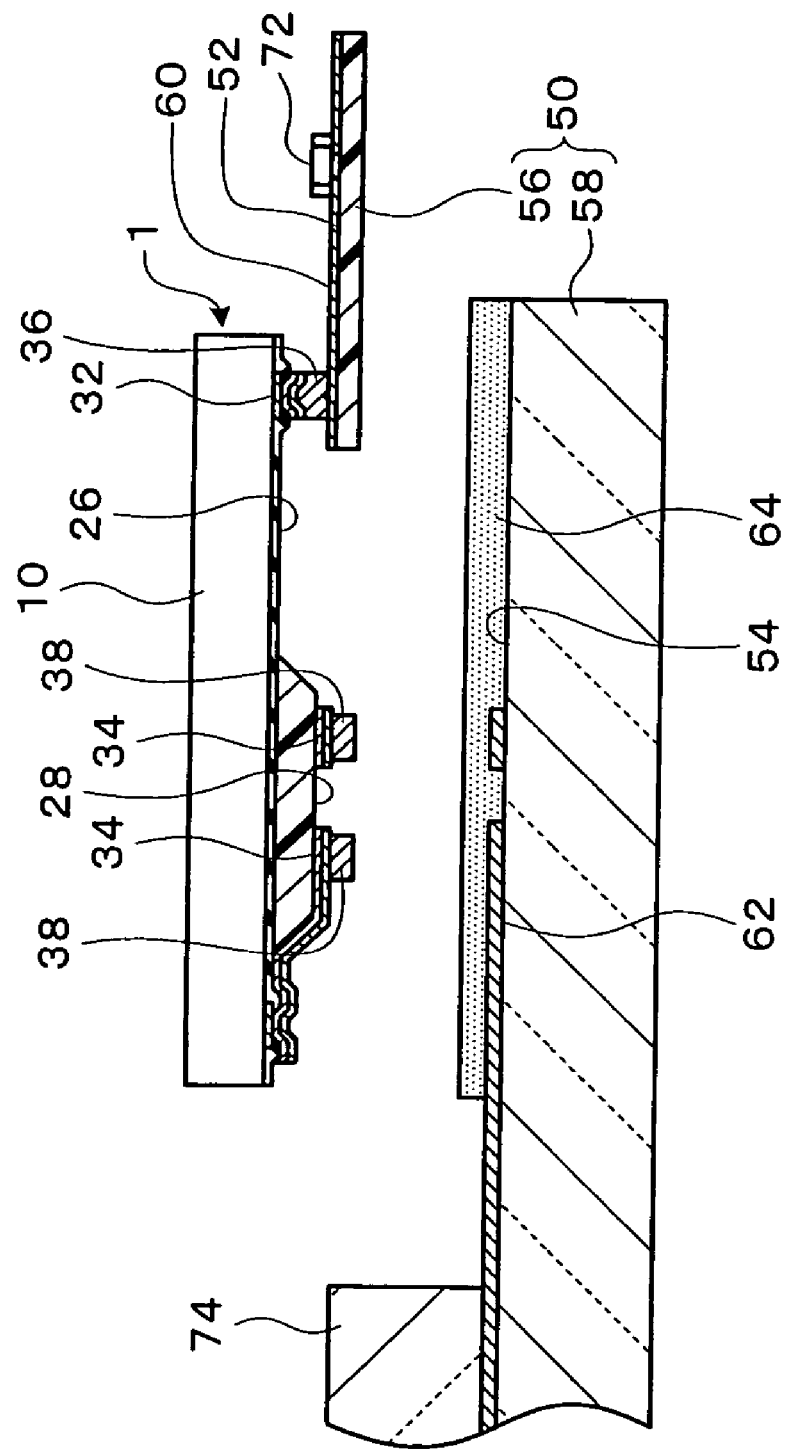
FIG. 7 is illustrative of another method of manufacturing an electronic device according to an embodiment of the present invention.

FIG. 7 is illustrative of another method of manufacturing an electronic device according to an embodiment of the present invention. In this manufacturing method, the first electrode 32 of the semiconductor device 1 is electrically connected face-to-face with the first interconnect pattern 60 formed on the first substrate 56. Specifically, the semiconductor device 1 is mounted on the first substrate 56 before being mounted on the second substrate 58. The first electrode 32 may be bonded to the first interconnect pattern 60 by pressure welding using an anisotropic conductive material or a resin, or an Au—Su alloy junction or Au—Au metal junction used for chip-on-film (COF) mounting. The semiconductor device 1 and the first substrate 56 are attached to the second substrate 58. In more detail, the second electrode 34 of the semiconductor device 1 is electrically connected face-to-face with the second interconnect pattern 62 formed on the second substrate 58. The anisotropic conductive material 64 (anisotropic conductive film or anisotropic conductive paste) may be used to electrically connect the electrode with the interconnect pattern. The electrical connection may be achieved by pressure welding using a resin. The first substrate 56 is attached to the second substrate 58 so that the electrical connection section of the first interconnect pattern 60 with the first electrode 32 overlaps the second substrate 58. The anisotropic conductive material 64 may be used for attachment. According to the present embodiment, a level difference is formed by allowing the first and second substrates 56 and 58 to overlap. However, since the first and second electrodes 32 and 34 of the semiconductor device 1 are formed on the surfaces at different heights, it is possible to be adapted to the level difference. The details described with reference to FIG. 6 apply to the rest of the details.

Figure 8:
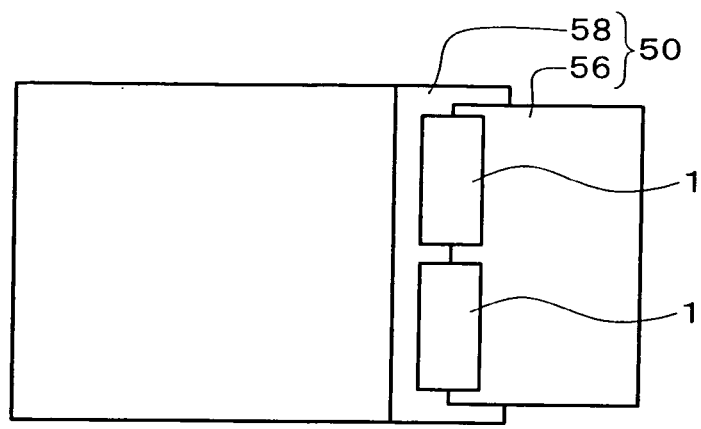
FIG. 8 is illustrative of a modification of an electronic device according to an embodiment of the present invention.

FIG. 8 is illustrative of a modification of the electronic device according to the present embodiment. In the electronic device shown in FIG. 8, a plurality of the semiconductor devices 1 are mounted on the support member 50. The above description applies to the details of the structure and the mounting form of the semiconductor device 1. The present invention also includes this embodiment.

Figure 9:
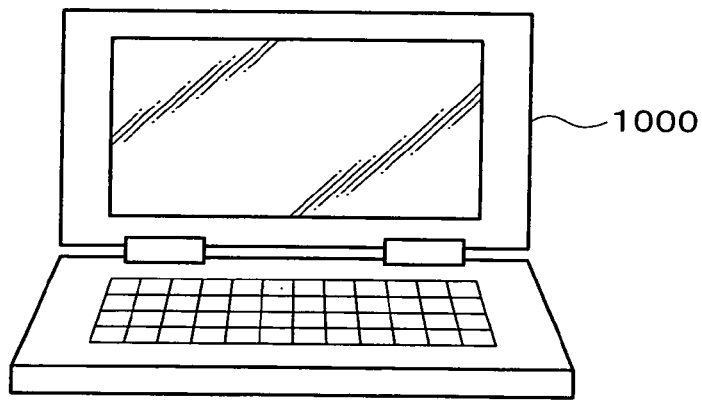
FIG. 9 shows an electronic instrument including an electronic device according to an embodiment of the present invention.
Figure 10:
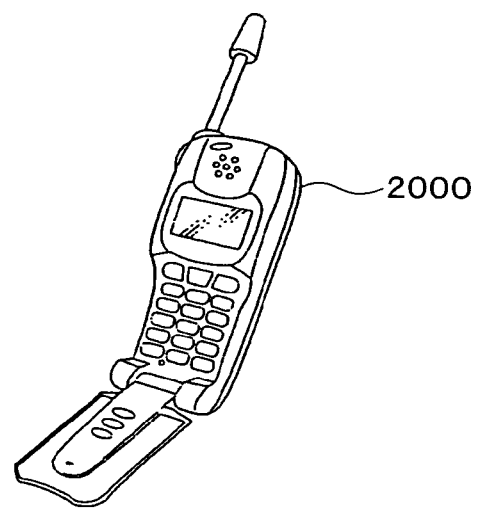
FIG. 10 shows another electronic instrument including an electronic device according to an embodiment of the present invention.

FIGS. 9 and 10 respectively show a notebook-type personal computer 1000 and a portable telephone 2000 as examples of electronic instruments including the electronic device according to an embodiment of the present invention.

The present invention is not limited to the above-described embodiments. Various modifications and variations can be made. For example, the present invention includes configurations substantially the same as the configurations described in the embodiments (in function, in method and effect, or in objective and effect). The present invention also includes a configuration in which an unsubstantial portion in the above-described embodiments is replaced. The present invention also includes a configuration having the same effects as the configurations described in the embodiments, or a configuration capable of achieving the same objective. Further, the present invention includes a configuration in which a known technique is added to the configurations described in the embodiments.

What is claimed is:

1. An electronic device comprising:
    a semiconductor substrate in which an integrated circuit is formed;
    an insulating layer which is formed on the semiconductor substrate and has a first upper surface;
    an elastically deformable section formed on the first upper surface, the elastically deformable section formed at a position closer to one of edges of the semiconductor substrate than a center of the semiconductor substrate, the elastically deformable section having a second upper surface;
    first and second electrodes which are electrically connected with an inside of the semiconductor substrate, the first electrode being formed on the first upper surface, the second electrode being formed on the second upper surface;
    a first substrate on which a first interconnect pattern is formed, the first interconnect pattern facing the first electrode and being electrically connected with the first electrode; and
    a second substrate on which a second interconnect pattern is formed, the second interconnect pattern facing the second electrode and being electrically connected with the second electrode,
    wherein the elastically deformable section is elastically deformed in a manner to be depressed under the second electrode, and presses the second electrode against the second interconnect pattern due to elasticity.

2. The electronic device as defined in claim 1, further comprising a bump formed between the second electrode and the second interconnect pattern, the second electrode being electrically connected with the second interconnect pattern through the bump.

3. The electronic device as defined in claim 2, wherein the bump includes a nickel layer.

4. A method of manufacturing an electronic device, comprising:
    mounting a semiconductor device having first and second electrodes on first and second substrates on which interconnect pattern are formed; and
    electrically connecting the first and second electrodes with the first and interconnect patterns, respectively, the semiconductor device including;
    a semiconductor substrate in which an integrated circuit is formed, the first and second electrodes being electrically connected with an inside of the semiconductor substrate;
    an insulating layer which is formed on the semiconductor substrate and has a first upper surface; and
    an elastically deformable section formed on the first upper surface, the elastically deformable section formed at a position closer to one of edges of the semiconductor substrate than a center of the semiconductor substrate, the elastically deformable section having a second upper surface, the first electrode formed on the first upper surface, the second electrode formed on the second upper surface,
    wherein, in the mounting step, the semiconductor device and the first and second substrate are disposed so that the first and second electrodes respectively faces the first and second interconnect patterns, and the elastically deformable section is elastically deformed in a manner to be depressed under the second electrode.

5. The method of manufacturing an electronic device as defined in claim 4,
    wherein the semiconductor device further includes a bump formed on the second electrode, and
    wherein the elastically deformable section is elastically deformed through the bump.

* * * * *